United States Patent [19]

Itoh

[11] Patent Number: 5,097,219
[45] Date of Patent: Mar. 17, 1992

[54] PLL FOR CONTROLLING FREQUENCY DEVIATION OF A VARIABLE FREQUENCY OSCILLATOR

[75] Inventor: Takashi Itoh, Nagaokakyo, Japan

[73] Assignee: Mitsubishi Denki Kabushiki Kaisha, Tokyo, Japan

[21] Appl. No.: 450,233

[22] Filed: Dec. 13, 1989

[30] Foreign Application Priority Data

Dec. 15, 1988 [JP] Japan .................. 63-317068
May 30, 1989 [JP] Japan .................. 1-138592
Sep. 27, 1989 [JP] Japan .................. 1-250903

[51] Int. Cl.$^5$ .............................................. H03L 7/00
[52] U.S. Cl. .................. 328/155; 307/271; 307/262; 331/17
[58] Field of Search .............. 307/271, 511, 525, 526, 307/529, 282; 328/155, 141, 14; 331/17, 25, 1 R

[56] References Cited

U.S. PATENT DOCUMENTS

| | | | |
|---|---|---|---|
| 3,470,488 | 9/1969 | Avignon | 331/4 |
| 3,717,821 | 2/1973 | Amemiya et al. | 330/26 |
| 3,984,780 | 10/1976 | Hsiao et al. | 330/35 |
| 4,021,752 | 5/1977 | Sato et al. | 331/17 |
| 4,024,464 | 5/1977 | Underhill et al. | 331/25 |
| 4,072,909 | 2/1978 | Citta | 331/25 |
| 4,225,830 | 9/1980 | Remy | 331/25 |
| 4,380,743 | 4/1983 | Underhill et al. | 307/271 |
| 4,429,283 | 1/1984 | Wittlinger | 330/257 |
| 4,495,468 | 1/1985 | Richards et al. | 328/155 |
| 4,518,929 | 5/1985 | Owen | 328/155 |
| 4,536,718 | 8/1985 | Underhill | 331/16 |
| 4,616,192 | 10/1986 | van Roermund | 331/25 |
| 4,654,864 | 3/1987 | Ichiyoshi | 328/155 |
| 4,746,870 | 5/1988 | Underhill | 307/511 |
| 4,870,684 | 9/1989 | Arai et al. | 331/25 |

FOREIGN PATENT DOCUMENTS

| | | |
|---|---|---|
| 0153868 | 9/1985 | European Pat. Off. |
| 60-14522 | 1/1985 | Japan |
| 62-97428 | 5/1987 | Japan |
| 1447418 | 8/1976 | United Kingdom |

OTHER PUBLICATIONS

"Fast Digital Frequency Synthesiser", by M. J. Underhill et al., Electronic Letters vol. 14, No. 11 (1978.05) pp. 342-343.

Electronic Letters, vol. 25, No. 10, 11th May 1989, pp. 673-675; Z. Wang et al.: "Adjustable Bidirectional MOS Current Mirror/Amplifier" *p. 673, right-hand column, Line 1—p. 674, left-hand column, Line 23; FIG. 2*.

Primary Examiner—Stanley D. Miller
Assistant Examiner—Toan Tran

[57] ABSTRACT

A control apparatus includes a phase comparator for generating a first control signal in accordance with the phase difference between a variable frequency signal and an input signal from the outside, a multiplier for multiplying the first control signal and a correction signal thereby to output a second control signal, a variable frequency oscillator for outputting the variable frequency signal in response to the second control signal, and a correction circuit for generating the correction signal for correcting a frequency deviation of the variable frequency signal from a predetermined value. An impedance conversion circuit which is of low input impedance and high output impedance includes a differential amplifier which is provided with a first terminal which receives a reference voltage obtained by resistors and a second terminal connected to an input terminal which receives an input current from the outside and which outputs a signal corresponding to the voltage difference between the first and second terminals. The impedance conversion circuit further includes a first current outputting circuit for outputting a current corresponding to a signal from the differential amplifier to the second terminal, and a second current outputting circuit for determining an output current against a signal from the differential amplifier and for outputting the output current to an external output terminal.

9 Claims, 5 Drawing Sheets

FIG. 7 (PRIOR ART)
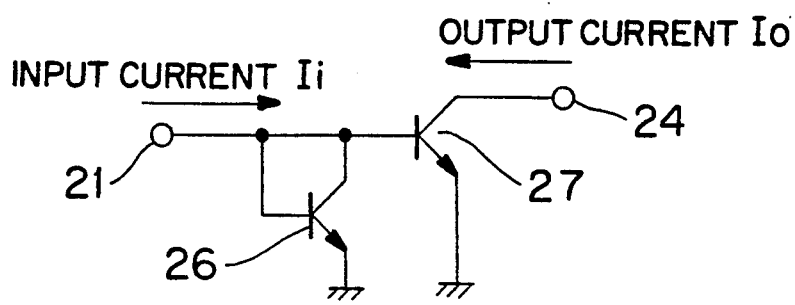
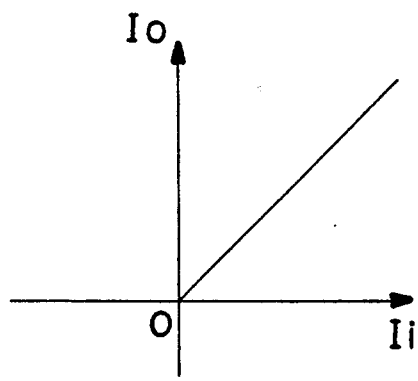
FIG. 8
(PRIOR ART)
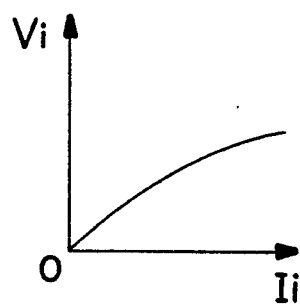
FIG. 9
(PRIOR ART)

PLL FOR CONTROLLING FREQUENCY DEVIATION OF A VARIABLE FREQUENCY OSCILLATOR

FIELD OF THE INVENTION

The present invention relates to a control apparatus, and more particularly to a PLL circuit (Phase Locked Loop) which includes a variable frequency generating means, and which outputs a signal synchronized with an input signal. Furthermore, the present invention relates to an impedance conversion circuit of low input impedance and high output impedance.

DESCRIPTION OF THE BACKGROUND ART

A prior art control apparatus will be described. In the following description, a variable frequency oscillator (hereinafter, referred to as "VFO") is used as a variable frequency generating means and a PLL circuit is used as a control apparatus.

The VFO which is an important constitutional element of a PLL circuit has variations dependent on elements, and further it is well known that it has variations dependent on the usage environment, such as a power supply voltage. FIG. 4 shows an example of control input vs. output frequency characteristics of the VFO. In the figure, reference character a represents a characteristic which is to be the design center, reference characters b and c represent characteristics in cases where the characteristics of the VFO varies. In order to enable a preferable operation as a PLL by using such three kinds of VFOs to obtain a predetermined frequency $f_O$, input signals of $v_a$, $v_b$, and $v_c$ are required as control inputs of the three VFOs. As a method of automatically correcting the variations of the characteristics of the VFO, there is a technique disclosed in Japanese Laid-open Patent Publication No. Sho 62-97428.

FIG. 6 is a block diagram of a control apparatus which conducts such an automatic correction. In FIG. 6, reference numeral 1 denotes a VFO outputting a variable frequency signal D, the frequency of which varies in response to the control signal C. Reference numeral 2 denotes a phase comparator circuit for detecting the phase difference between the variable frequency signal D and the input signal A from the outside to output an error detection signal B. Reference numeral 3 denotes a correction circuit for detecting the deviation of the frequency of the variable frequency signal D from a predetermined value ($f_O$) to output a correction signal E. Reference numeral 4 denotes an adder.

The device will operate as follows.

When the input signal A does not exist, the phase comparator 2 outputs 0 as the error signal B. Then, a control circuit which makes the frequency of the signal D of the VFO 1 be a predetermined value $f_O$ is constituted by the adder 4, the VFO 1, and the correction circuit 3, and the frequency of the signal D becomes $f_O$. On the other hand, when the signal A is input, the signal D becomes equal to the predetermined frequency $f_O$, and the signal D synchronized with the input signal A is obtained as the output of the PLL.

FIG. 5 shows characteristics of the signal D with respect to the signal C of FIG. 6. That is, the correction signals $v_a$, $v_b$, and $v_c$ shown in FIG. 4 are obtained from the correction circuit 3, and a predetermined frequency $f_O$ is obtained at a single value (for example, O) as the control signal C.

However, as is apparent from the curves a, b', and c' of FIG. 5, the control input vs. output frequency characteristics vary dependent on the variations of the characteristics of the VFO 1. That is, in the prior art control apparatus, the variation of the sensitivity of the VFO 1 is not corrected, thereby resulting in a large loss in the controllability.

SUMMARY OF THE INVENTION

It is an object of the present invention to provide a control apparatus which is stable against variations in the nominal output frequency the sensitivity of the variable frequency generating means.

It is a second object of the present invention to provide a control apparatus which is further capable of establishing the change of the frequency characteristics of the variable frequency signal against a phase error signal and capable of easily obtaining a desired gain.

It is a third object of the present invention to provide an impedance conversion apparatus capable of making the voltage of the external input terminal a constant value and capable of obtaining an output current even when an input current from an external input terminal has a negative value.

Other objects and advantages of the present invention will become apparent from the detailed description given hereinafter; it should be understood, however, that the detailed description and specific embodiments are given by way of illustration only, since various changes and modifications within the spirit and the scope of the invention will become apparent to those skilled in the art from this detailed description.

According to a first aspect of the present invention, a control apparatus is provided with an error detecting means for generating a first control signal in accordance with the phase difference between a variable frequency signal and an input signal from the outside, a multiplier means for multiplying the first control signal and a correction signal to output a second control signal, a variable frequency generating means for outputting the variable frequency signal, the frequency of which varies in response to the second control signal, and a correcting means for generating the correction signal for correcting the frequency deviation of the variable frequency signal from a predetermined value. Therefore, the variations or fluctuations in the sensitivity of the variable frequency generating means are suppressed.

According to a second aspect of the present invention, a control apparatus is provided with an error detecting means for generating a first control signal in accordance with the phase difference between a variable frequency signal and an input signal from the outside, a frequency correcting means for generating a voltage signal for correcting the deviation of the variable frequency signal from a predetermined value, and a first current input means which receives the first control signal via a resistor and is of low input impedance. The apparatus further includes a second current input means which receives the correction signal via a resistor and is of low input impedance, a multiplier means which multiplies the output signal of the first current input means by that of the second current input means to output a second control signal, and a variable frequency generating means for outputting the variable frequency signal, the frequency of which varies in response to the second control signal. Therefore, the change of the frequency characteristics of the variable frequency signal against the phase error signal can be arbitrary established and a desired gain can be easily obtained.

According to a third aspect of the present invention, an impedance conversion circuit which is of low input impedance and high output impedance is provided with a differential amplifier means which, provided with a first terminal which receives the reference voltage supplied from a voltage source and a second terminal directly connected to an input terminal which receives an input current from the outside, outputs a signal corresponding to the voltage difference between the first terminal and the second terminal. Furthermore, the circuit includes a first current outputting means for outputting a current in response to a signal from the differential amplifier means to the second terminal, and a second current outputting means which determines an output current against a signal from the differential amplifier means and outputs the output current to an external output terminal. Therefore, an impedance conversion circuit in which the voltage of the input terminal can be made constant and an output current can be obtained from the output terminal, even when the input current of the input terminal has a negative value, can be obtained.

BRIEF DESCRIPTION OF THE DRAWINGS

The present invention will become more fully understood from the detailed description given hereinbelow and the accompanying drawings which are given by way of illustration only, and thus are not limitative of the present invention, and wherein:

FIG. 3 is a circuit diagram showing a construction of an impedance conversion circuit according to a third embodiment of the present invention;

FIG. 7 is a circuit diagram showing a construction of a conventional current mirror circuit; and FIGS. 8 and 9 are diagrams showing the characteristics of the current mirror circuit of FIG. 7.

DETAILED DESCRIPTION OF THE PREFERRED EMBODIMENT

An embodiment of the present invention will be described in detail with reference to the drawings.

As discussed above, a main object of the present invention is to make the sensitivity of the VFO constant. That is, to realize that the characteristics a, b', and c' of the VFO shown in FIG. 5 are all equivalent to a.

Figure 1:
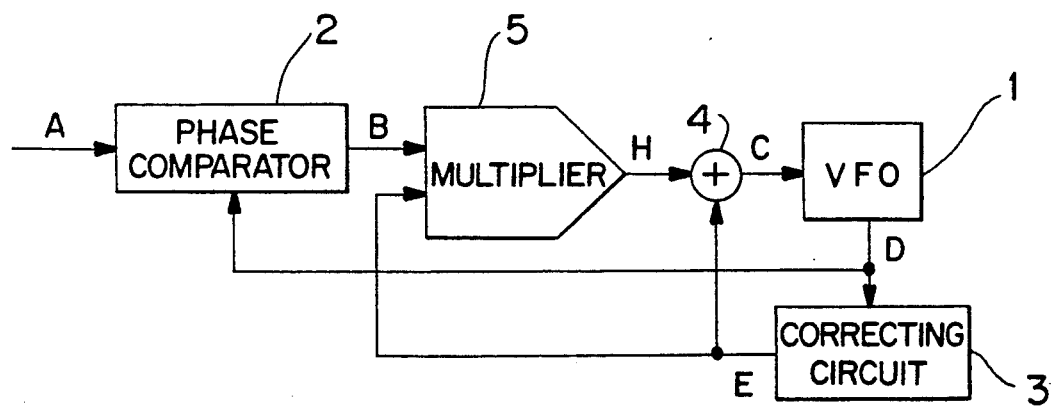
FIG. 1 is a block diagram showing a construction of a control apparatus according to a first embodiment of the present invention.
Figure 6:
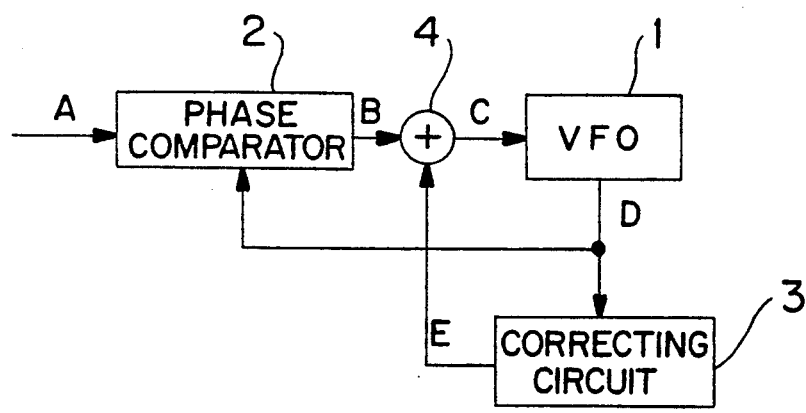
FIG. 6 is a diagram showing a construction of a conventional control apparatus.

FIG. 1 shows a control apparatus according to a first embodiment of the present invention. In FIG. 1, the same reference numerals designate the same or corresponding elements as those shown in FIG. 6. Reference numeral 5 denotes a multiplier for multiplying the correction signal E, for correcting the deviation of the variable frequency signal D from the predetermined value ($f_O$), and the phase error signal B which is considered as a first control signal. The multiplied output is considered as a second control signal H and is input to the adder 4. Herein, the frequency fd of the output signal D with respect to the voltage $V_c$ of the input signal C of the VFO 1 is represented by the following formula, $$fd = G \cdot V_c \text{ [Hz]} \quad (1)$$

where G is the sensitivity of VFO.

Figure 5:
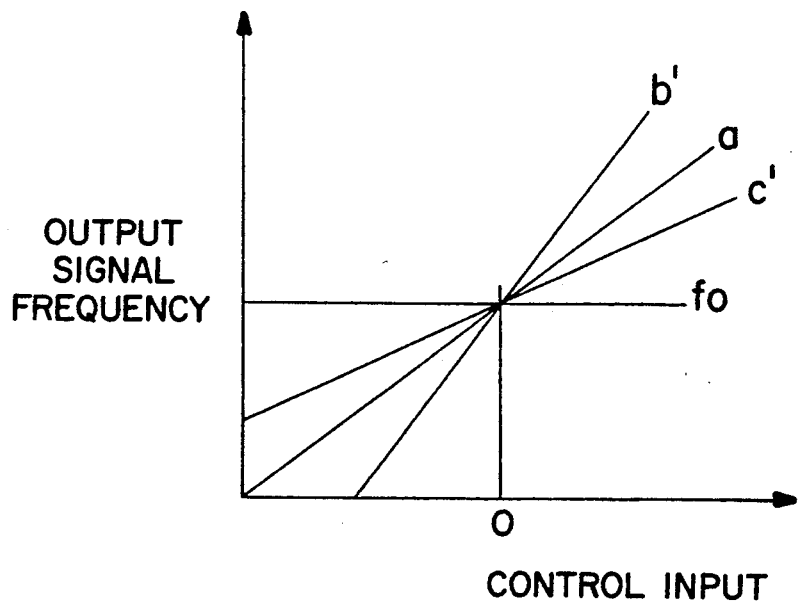
FIG. 5 is a diagram showing the control input vs. output frequency characteristics of the VFO in the correction operation for correcting the center frequency.

The frequency fd of the signal D with respect to the signal H is as shown in FIG. 5, and $v_a$ is equal to 0 V. That is, the characteristics of the VFO 1 against the voltage $V_h$ of the signal H is represented as in the following.

$$fd = G \cdot (V_h + v_a) \quad (2)$$
$$= G \cdot V_h + G \cdot v_a$$

Furthermore, the sensitivity G is represented as in the following, $$G = fd/V_c \text{ [Hz/V]} \quad (3)$$

and because the correction signal E is a voltage $v_a$ which makes the signal D a predetermined frequency $f_O$, the sensitivity G is represented as in the following.

$$G = f_O/v_a \quad (4)$$

From the formulae (2) and (4), $$fd = \frac{f_0}{v_a} \cdot V_h + f_0. \quad (5)$$

That is, the sensitivity $G_h$ of the VFO 1 against the voltage $V_h$ is represented by the following formula.

$$G_h = \frac{d}{dV_h} fd = \frac{f_0}{v_a} \quad (6)$$

The phase error signal B and the correction signal E which is equal to the voltage $v_a$ are input to the multiplier 5, and the voltage $V_h$ against the voltage $V_b$ of the signal B becomes as follows, $$V_h = v_a \cdot V_b \quad (7)$$

Because the frequency fd of the signal D which is a variable frequency signal against the voltage $V_b$ of the signal B which is the first control signal, is represented as in the following, $$fd = \frac{f_0}{v_a} V_h + f_0 \quad (8)$$
$$= f_0 \cdot V_b + f_0.$$

That is, even when variations or fluctuations arise in the characteristics of the VFO 1, the characteristics of the frequency of the variable frequency signal against the first control signal becomes constant.

While in the above-illustrated embodiment a control apparatus having an adder 4 is described, the adder may be removed if a predetermined offset value is multiplied with the phase error signal B in an additional multiplier disposed between phase comparator 2 and multiplier 5. Although this offset value can be obtained by providing an adder which adds a constant value to the signal B between the phase comparator 2 and the multiplier 5, it can also be obtained as a characteristic of the phase comparator 2 itself. For example, in a case where the phase comparator 2 is constituted mainly be a general purpose CMOS logic IC, the output of the IC is 0 V or 5 V which is the power supply voltage of the IC, and the average voltage (which is obtained when the output waveform of the IC is smoothed) when the phase error is 0 (corresponding to a case where the control input of FIG. 5 is equal to 0) becomes 2.5 V. That is, this voltage 2.5 V corresponds to the offset value and in such a case the same effects as the above-described embodiment can be obtained without the adder 4.

As is evident from the foregoing description, the PLL circuit of the above-described construction can suppress the variations or fluctuations in the sensitivity and the nominal output frequency of VFO and its characteristics can be made constant. However, this does not always mean that a desired characteristic is obtained. In other words, while a circuit gain which mainly controls the constant characteristics is determined by the multiplier 5, the characteristics of the multiplier 5 is not considered at all. A construction of the control apparatus which can easily establish the characteristics of the multiplier at an arbitrarily one is shown in the following.

Figure 2:
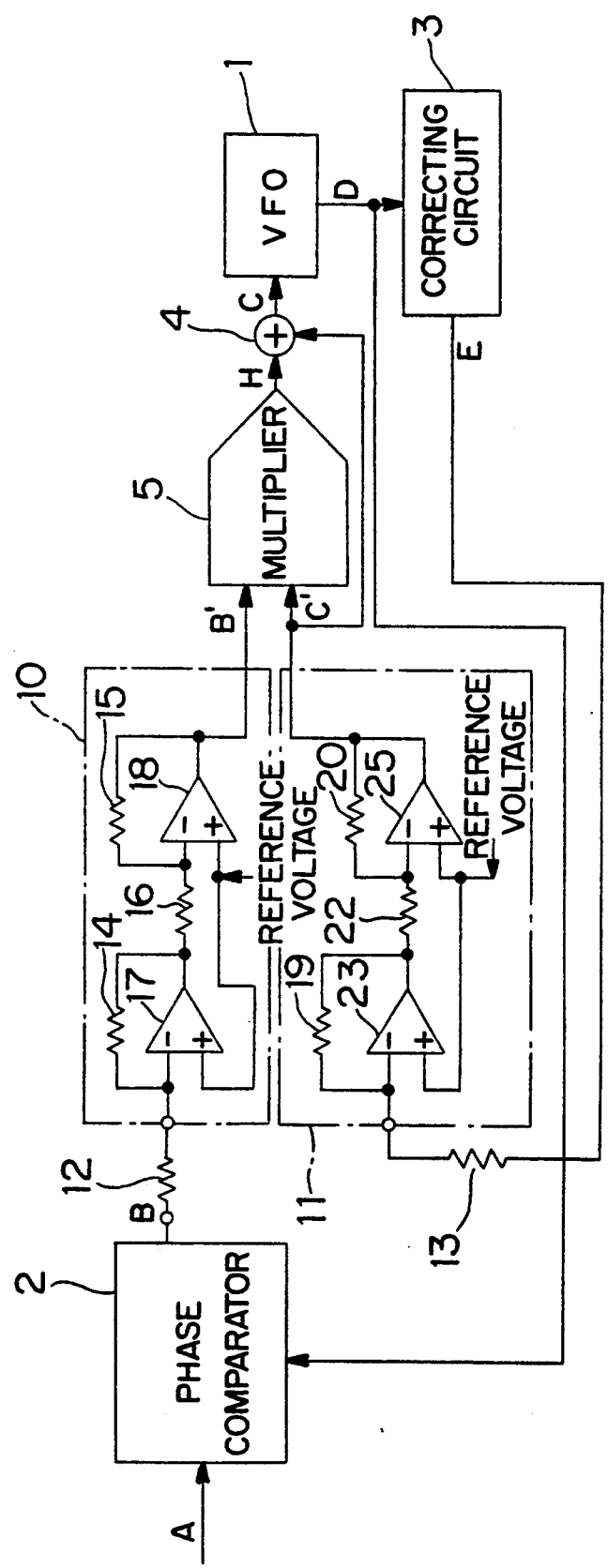
FIG. 2 is a block diagram showing a construction of a control apparatus according to a second embodiment of the present invention.
Figure 4:
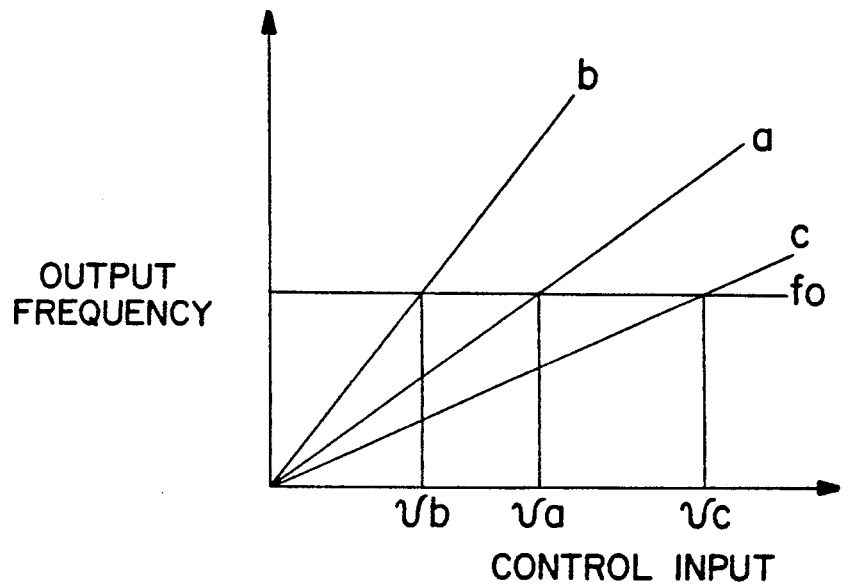
FIG. 4 is a diagram showing the control input vs. output frequency characteristics of the VFO.

FIG. 2 shows a PLL circuit according to a second embodiment of the present invention. In FIG. 2, like reference numerals denote the same portions as those shown in FIG. 1. Reference numeral 10 denotes a first current voltage converter (first current input means) constituted by resistors 14, 15, and 16 and amplifiers 17 and 18. Reference numeral 11 denotes a second current voltage converter (second current input means) constituted by resistors 19, 20, and 22 and amplifiers 23 and 25. Reference numerals 12 and 13 denote resistors.

The device will operate as follows.

The current voltage converters 10 and 11 have an input impedance of about 0. The first control signal B from the phase comparator 2 is input to the current-voltage converter 10 via the resistor 12. In the phase comparator 2, the ratio of the voltage $V_B$ of the signal B to the phase difference $\theta$ between the signals A and D, that is, the sensitivity of the phase comparator 2 is $G\theta[V/rad]$. The values of the resistors 12 and 13 are assumed to be $R_1$ and $R_2$, and the conversion gains of the current voltage converters 10 and 11 to be $G_1 [V/A]$ and $G_2 [V/A]$, respectively. Then, the sensitivity $G_3$ of the input signal B' of one input of the multiplier 5 against the phase difference $\theta$ is represented as follows, $$G_3 = \frac{1}{R_1} \cdot G\theta \cdot G_1.$$

That is, even when the characteristics of the phase comparator 2 and the multiplier 5 are fixed, the characteristics of the PLL circuit can be arbitrarily set by varying the value of the resistor 12.

By appropriately setting the value of the resistor 13 against the frequency correction signal E similarly as above, the settling characteristics of the frequency correcting operation can be arbitrary set.

That is, the correction circuit 3 receives the signal D from the VFO 1 and outputs the correction signal E as a voltage which makes the signal D a frequency $f_O$. When the frequency of the signal D is made $f_d$ and the voltage $V_E$ corresponding to the frequency $f_O$ and $f_d$ are made $V_O$ and $V_d$, respectively, the sensitivity $G_f$ of the correction circuit 3 is represented by the following.

$$G_f = \frac{(V_d - V_0)}{(f_d - f_o)} \ [V/Hz]$$

Then, the sensitivity $G_4$ of the other input signal C' of the multiplier 5 against the frequency difference $(f_d - f_O)$ becomes $$G_4 = \frac{1}{R_2} \cdot G_f \cdot G_2,$$

and the characteristics can be changed by the value of the resistor 13.

In such an embodiment, a stable control can be conducted against the variations of the variable frequency generating means, and the frequency change of the variable frequency signal D against the phase error signal B can be arbitrarily set, thereby enabling the attainment of a desired gain easily.

While in the above-illustrated embodiment an adder 4 is provided, this adder 4 may be removed if a constant offset value is multiplied with the input signal of the multiplier similarly as in the first embodiment.

While in the first and second embodiments a PLL circuit is described as a control apparatus, the present invention may not be restricted thereto.

While in the above-illustrated embodiment current voltage converters 10 and 11 are used as current input means, these current input means may not be restricted thereto. For example, it may be that the current input means is of a current input and current output type circuit and the multiplier 5 is of a current input type.

FIG. 3 shows a current input circuit of a current input and current output type according to a third embodiment of the present invention. This current input circuit is an impedance conversion circuit of a type of low input impedance and high output impedance. In FIG. 3, reference numeral 21 denotes an input terminal to which a current $I_i$ is supplied from the outside. Reference numeral 24 denotes an output terminal. Reference numerals 30, 31, 35, 36, 45, 50, and 63 denote N channel MOS transistors. Reference numerals 32, 33, 34, 46, 51, 61, and 62 denote P channel MOS transistors. Reference numerals 40, 41, and 60 denote resistors. Reference numeral 37 denotes a differential amplifier circuit comprising transistors 30 to 36. Reference numeral 47 denotes a first current outputting stage comprising transistors 45 and 46. Reference numeral 52 denotes a second current outputting stage comprising transistors 50 and 51 whose drains are connected to the external output terminal 24.

The device will operate as follows.

A reference voltage $V_R$ (constant voltage) which is obtained by dividing the power supply voltage by the resistors 40 and 41 is given to the first terminal 31' of the differential amplifier stage 37 (gate of the transistor 31). Furthermore, a voltage $V_i$ which is to be compared with the reference voltage $V_R$ is given to the second terminal 30' (gate of the transistor 30), and a signal corresponding to the difference between the reference voltage $V_R$ of the first terminal and the voltage $V_i$ of the second terminal is output as an output signal of the differential amplifier stage 37 from the drain of the transistor 35. Then, the first current outputting stage 47 receives the output signal from the differential amplifier stage 37, and outputs a current $I_1$ which makes the voltage $V_i$ of the second terminal equal to the reference voltage $V_R$. Thus, the input terminal voltage $V_i$ becomes equal to the reference voltage $V_R$ and is kept constant. Such feedback operation which makes the input terminal voltage $V_i$ equal to the reference voltage $V_R$ is conducted each time when the input current $I_i$ is input. That is, in order to make the input terminal voltage $V_i$ constant, the input current $I_i$ and the output current $I_1$ of the first current outputting means are made equal to each other.

Furthermore, to the second current outputting stage 52 having the same electrical characteristics as the first current outputting means 47, the same signal as the output of the first current outputting stage 47 is given from the differential amplifier stage 37. In the second current outputting means 52, the drains of the transistors 51 and 50 are connected to the external output terminal 24 and the output current $I_O$ of the second current outputting means 52 does not depend on the output terminal voltage $V_O$. Therefore, the output current $I_O$ is equal to the output current $I_1$ of the first current outputting stage 47. Furthermore, as described above, $I_1$ is equal to $I_i$ and the input current $I_i$ and the output current $I_O$ of the impedance conversion circuit of this embodiment are made equal to each other.

From the above-described fact, as for the input impedance $Z_i=(dV_i/dI_i)$, the $V_i$ is kept constant to be $V_R$ and it is of low impedance. As for the output impedance $Z_O=(dV_O/dI_O)$, the output current $I_O$ becomes constant regardless of the output terminal voltage $V_O$ which is established from the outside while $V_O$ changes, thereby making $Z_O$ infinite, resulting in a high output impedance.

The impedance conversion circuit of the present embodiment does not include such as an operational amplifier. Therefore, relative to the current input means 10 and 11 of FIG. 2, the number of elements constituting a circuit can be greatly reduced, thereby minimizing the size of the circuit. This results in easy mounting in construction an IC and is quite effective in view of integration.

Furthermore, when a control apparatus is to be constituted by using the impedance conversion circuit of FIG. 3, and the current input means 10 and 11 of the PLL circuit of FIG. 2 which are of a current input and voltage output type, and the multiplier which is of a voltage input type, only the portions comprising the resistors 14 and 15 and the amplifier 17 of the current voltage converter 10, and the resistors 19 and 20 and the amplifier 23 of the current voltage converter 11 may be replaced by the impedance conversion circuit of FIG. 3.

In order to explain the effects of the impedance conversion circuit of the above-described embodiment, a so-called current mirror circuit which is generally used as in prior art will be described.

FIG. 7 shows a construction of the current mirror circuit. In FIG. 7, reference numeral 21 denotes an input terminal to which a current $I_i$ is supplied from the outside. Reference numeral 26 denotes a transistor whose collector and base are connected with each other thereby to function as a diode, and this transistor determines the voltage $V_i$ in response to the current $I_i$. Reference numeral 27 denotes a transistor through which a collector current $I_O$ flows in accordance with the voltage $V_i$, and it has the same characteristics as the transistor 26. Reference numeral 24 denotes an output terminal.

The device will operate as follows.

As is well known, the input current $I_i$ and the output current $I_O$ become to have the same value in the positive value range. When $I_i$ is negative, the base of the transistor 27 is not driven as shown in FIG. 9, and the collector current $I_O$ as shown in FIG. 8, that is, the output current $I_O$ would not flow. Further, the voltage $V_i$ of the input terminal 21 against the input current $I_i$ is determined by the operation characteristics of the diode of the transistor 26, and a relation shown in FIG. 9 is obtained. This characteristic is similar to that of the diode and is of low impedance. When the voltage $V_O$ of the output terminal 24 is positive, the output current $I_O$ becomes constant regardless of the voltage $V_O$ and becomes of sufficiently high impedance. Thus, the prior art current mirror circuit functions as an impedance conversion circuit having a low input impedance and a high output impedance. However, there was a problem that it does not operate when the input current $I_i$ is negative or that the voltage $V_i$ of the input terminal changes dependent on the input current $I_i$ and is not constant. To the contrary, the impedance conversion circuit of the third embodiment of the present invention can make the voltage of the input terminal constant in accordance with the signal by the differential amplifier stage 37, and it is possible to obtain the output current from the external output terminal regardless of whether the input current $I_i$ is positive or negative. Therefore, even when the input current $I_i$ is negative, the variation of the voltage $V_i$ of the input terminal against the input current $I_i$ can be suppressed.

While in the above-described embodiment the output current $I_o$ is equal to the current input current $I_i$, the present invention is not restricted thereto. If the $I_i$ and $I_O$ are in proportion to each other, the present invention can be utilized with the same effects as the above-described embodiment.

As is evident from the foregoing description, according to a first aspect of the present invention, a control apparatus is provided with a multiplier means for multiplying a first control signal, such as speed error information, and the correction signal thereby to output a second control signal, a variable frequency generating means for outputting a variable frequency signal the frequency of which varies in response to the second control signal, a phase comparator means for producing the first control signal as phase error information between the variable frequency signal and the input signal from the outside, and a correcting means for generating a correction signal for correcting the deviation of the variable frequency signal from a predetermined value. Therefore, a stable control can be conducted independent of the variations of the output of the variable frequency generating means.

According to a second aspect of the present invention, a control apparatus is provided with a phase comparator for outputting a voltage signal in accordance with the phase difference between the input signals, a first and a second current input means for receiving voltage signals from the phase comparator and the frequency comparator via resistors, and a variable frequency oscillator, the oscillation frequency of which is controlled by the first and second current input means.

Therefore, a stable control can be conducted independent of the variations of the output of the variable frequency generating means, and the change of the frequency characteristics of the variable frequency signal against the phase error signal can be set arbitrarily, thereby enabling the attainment of a desired gain.

According to a third aspect of the present invention, an impedance conversion circuit is provided with a differential amplifier stage for outputting a signal in accordance with the voltage difference between the first and the second terminals wherein and the first terminal is one for receiving a reference voltage obtained via resistors which divide a power supply voltage and the second terminal is connected to the input terminal for supplying an input current from the outside, a first current outputting means for outputting a current in accordance with the current from the differential amplifier stage to the second terminal, and a second current outputting means for determining an output current against the signal from the differential amplifier stage and outputting this output current to the external output terminal. Therefore, the voltage of the external input terminal is made constant, and even when the input current of the external input terminal is of a negative value, the output current is obtained from the external output terminal.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A control apparatus comprising:
   error detecting means for generating a first control signal in accordance with a phase difference between a variable frequency signal and an external input signal;
   multiplier means for multiplying said first control signal and a correction signal thereby to output a second control signal;
   variable frequency generating means for outputting said variable frequency signal in response to said second control signal; and
   correcting means for generating said correction signal for correcting a frequency deviation of said variable frequency signal from a predetermined value.

2. A control apparatus comprising:
   error detecting means for generating a first control signal in accordance with a phase difference between a variable frequency signal and an external input signal;
   multiplier means for multiplying said first control signal and a correction signal;
   adder means for adding an output of said multiplier means and said correction signal thereby to output a second control signal;
   variable frequency generating means for outputting said variable frequency signal, the frequency of which varies in response to said second control signal; and
   correcting means for generating said correction signal for correcting a frequency deviation of said variable frequency signal from a predetermined value.

3. A control apparatus comprising:
   error detecting means for generating a first control signal in accordance with a phase difference between a variable frequency signal and an external input signal;
   correcting means for generating a correction signal for correcting a frequency deviation of said variable frequency signal from a predetermined value;
   first current input means for receiving said first control signal via a first resistor and for assuming a state of low input impedance and high output impedance;
   second current input means for receiving said correction signal via a second resistor and for assuming a state of low input impedance and high output impedance;
   multiplier means for multiplying output signals of said first current input means and said second current input means thereby to output a second control signal; and
   variable frequency generating means for outputting said variable frequency signal, the frequency of which varies in response to said second control signal.

4. A control apparatus comprising:
   error detecting means for generating a first control signal in accordance with a phase difference between a variable frequency signal and an external input signal;
   correcting means for generating a correction signal for correcting a frequency deviation of said variable frequency signal from a predetermined value;
   first current input means for receiving said first control signal via a first resistor and for assuming a state of low input impedance and high output impedance;
   second current input means for receiving said correction signal via a second resistor and for assuming a state of low input impedance and high output impedance;
   multiplier means for multiplying output signals of said first and second current input means;
   adder means for adding an output of said multiplier means and said output signal of said second current input means thereby to output a second control signal; and
   variable frequency generating means for outputting said variable frequency signal, the frequency of which varies in response to said second control signal.

5. The control apparatus of claim 3, wherein the sensitivity of said first control signal with respect to the phase difference of said error detecting means is variable upon variation of the value of said first resistor to arbitrarily set characteristics of the control apparatus.

6. The control apparatus of claim 3, wherein the variation of frequency of said variable frequency generating means with respect to said first control signal is arbitrarily set upon variation of the value of said second resistor to obtain a desired gain of the control apparatus.

7. A method of stabilizing a phase locked loop against variations in output frequency and sensitivity of variable frequency generating means comprising the steps of:
   generating a first control signal, in error detecting means, in accordance with a phase difference between a reference input signal and a variable frequency signal output of the variable frequency generating means;

generating a correction signal, in correcting means, for correcting a frequency deviation of the variable frequency signal from a predetermined value; and multiplying the first control signal and the correction signal, in a multiplier, to generate a second control signal, the variable frequency generating means outputting the variable frequency signal in response to the second control signal so that the frequency of the variable frequency signal is constant with respect to the first control signal regardless of the variations or fluctuations in characteristics of the variable frequency generating means.

8. A method of stabilizing a phase locked loop against variations in output frequency and sensitivity of variable frequency generating means comprising the steps of:

generating a first control signal, in error detecting means, in accordance with a phase difference between a reference input signal and a variable frequency signal output of the variable frequency generating means;

generating a correction signal, in correcting means, for correcting a frequency deviation of the variable frequency signal from a predetermined value;

multiplying the first control signal and the correction signal, in a multiplier, to generate a first output signal; and adding the first output signal and the correction signal, in an adder, to generate a second control signal, the variable frequency generating means outputting the variable frequency signal in response to the second control signal so that the frequency of the variable frequency signal is constant with respect to the first control signal regardless of the variations or fluctuations in characteristics of the variable frequency generating means.

9. A control apparatus for outputting a signal stabilized with respect to output frequency and sensitivity of variable frequency generating means comprising:

error detecting means, coupled to the variable frequency generating means, for generating a first control signal in accordance with a phase difference between a variable frequency signal output of the variable frequency generating means and a reference input signal;

correction means, coupled to the variable frequency generating means, for generating a correction signal for correcting a frequency deviation of the variable frequency signal from a predetermined value;

multiplier means, coupled to said error detecting means and said correction means, for multiplying said first control signal and said correction signal to generate a first output signal; and adder means, coupled to said multiplier means and said correction means, for adding said first output signal and said correction signal to generate a second control signal, the variable frequency generating means outputting the variable frequency signal in response to said second control signal so that the frequency of the variable frequency signal is constant with respect to said first control signal regardless of variations or fluctuations in characteristics of the variable frequency generating means.

* * * * *